(12) United States Patent
Lee (10) Patent No.: US 7,030,415 B2
(45) Date of Patent: Apr. 18, 2006

(54) SEMICONDUCTOR QUANTUM DOT OPTICAL AMPLIFIER, AND OPTICAL AMPLIFIER MODULE AND OPTICAL TRANSMISSION SYSTEM USING THE SAME

(76) Inventor: Dong-han Lee, 405-506 Expo APT, Jeonmin-doing, Yuseong-gu, 305-762 Daejeon (KR)

( * ) Notice: Subject to any disclaimer, the term of this patent is extended or adjusted under 35 U.S.C. 154(b) by 0 days.

(21) Appl. No.: 10/473,049

(22) PCT Filed: Mar. 27, 2002

(86) PCT No.: PCT/KR02/00531

§ 371 (c)(1),
(2), (4) Date: Sep. 26, 2003

(87) PCT Pub. No.: WO02/079813

PCT Pub. Date: Oct. 10, 2002

(65) Prior Publication Data

US 2004/0099858 A1    May 27, 2004

(30) Foreign Application Priority Data

Mar. 28, 2001 (KR) .......................... 2001-0016243
Mar. 30, 2001 (KR) .......................... 2001-0016821

(51) Int. Cl.
*H01L 27/15* (2006.01)
(52) U.S. Cl. .......................... 257/79; 257/86; 257/94; 257/99; 257/103
(58) Field of Classification Search ........... 257/79–103
See application file for complete search history.

(56) References Cited

U.S. PATENT DOCUMENTS 6,625,337 B1 *  9/2003  Akiyama .................... 385/14

* cited by examiner

*Primary Examiner*—Long Pham
*Assistant Examiner*—Wai-Sing Louie
(74) *Attorney, Agent, or Firm*—Rabin & Berdo, P.C.

(57) ABSTRACT

The present invention relates to an optical communication, and more particularly, to a wideband wavelength division multiplexing (WDM) optical communication system which can have a broad amplification band while overcoming a polarization dependency and solving a signal leakage between channels. In an optical amplifier module and optical transmission system for a WDM optical communication system using this, the optical amplifier module uses a semiconductor quantum dot optical amplifier as an amplifying means, and thus has a wide amplification bard and has no a polarization dependency of a gain and a signal leakage between channels, and the optical transmision system uses a semiconductor quantum dot optical amplifier module when several optical amplifier modules are connected for use so that a gain automatically becomes flat and automatically becomes fixed even though a channel number and an input signal size become different. Accordingly, the semiconductor quantum dot optical amplifier module of the present invention can be used as a repeater, an amplifier of a metro WDM system, and an amplifying means for the other systems of a WDM type. The optical transmission system using the semiconductor quantum dot optical amplifier module of the present invention can be used in a long-distance transmission system of a WDM type and a WDM network which pass through the optical amplifier module several times.

28 Claims, 10 Drawing Sheets

SEMICONDUCTOR QUANTUM DOT OPTICAL AMPLIFIER, AND OPTICAL AMPLIFIER MODULE AND OPTICAL TRANSMISSION SYSTEM USING THE SAME

BACKGROUND OF THE INVENTION

1. Field of the Invention

The present invention relates to an optical communication, and more particularly, to a semiconductor quantum dot optical amplifier that has not a polarization dependency and a signal leakage between channels but has a wide gain band by forming a quantum dot active layer between clad layers, an optical amplifier module which has a feature suitable for a WDM optical communication system and has a wide gain band including a wavelength band which could not be amplified by a conventional optical amplifier, and an optical transmission system which is formed by connecting several optical amplifiers using the optical amplifier module and that a gain flatness is automatically performed and a gain is automatically fixed in spite of a variation of channel.

2. Description of Related Art

As a communication technology has been developed, an implementation of a WDM optical communication system has become possible and, thus a communication capacity has also been significantly increased. However, in spite of such a development of the communication technology, 70 nm band which is a currently available band of an optical fiber amplifier cannot keep pace with a demand of rapidly increasing communication capacity. Hence, there is a need for an optical amplifier which can use an entire band range of 1250 nm to 1650 nm which is a low absorption band.

A conventional rare earth doped optical fiber amplifier has a feature that a gain band is determined by a corresponding rare earth element, but now other rare earth doped optical fiber amplifiers except the erbium doped optical fiber amplifier are inefficient.

On the other hands, a semiconductor optical amplifier has an advantage in that a gain band can be selected by adjusting an energy gap. Therefore, if such a semiconductor optical amplifier is used as an optical amplifier for an optical communication, it is expected to solve a problem resulting from a rapidly increasing communication capacity because a desired wavelength band is obtained.

Figure 1:
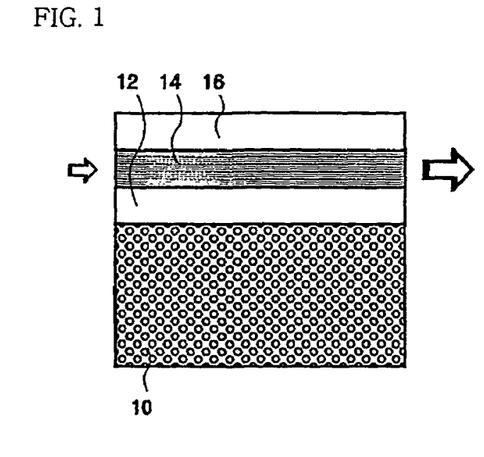
FIG. 1 is a cross-sectional view illustrating a conventional semiconductor optical amplifier having an active layer made of a quantum well.
Figure 2:
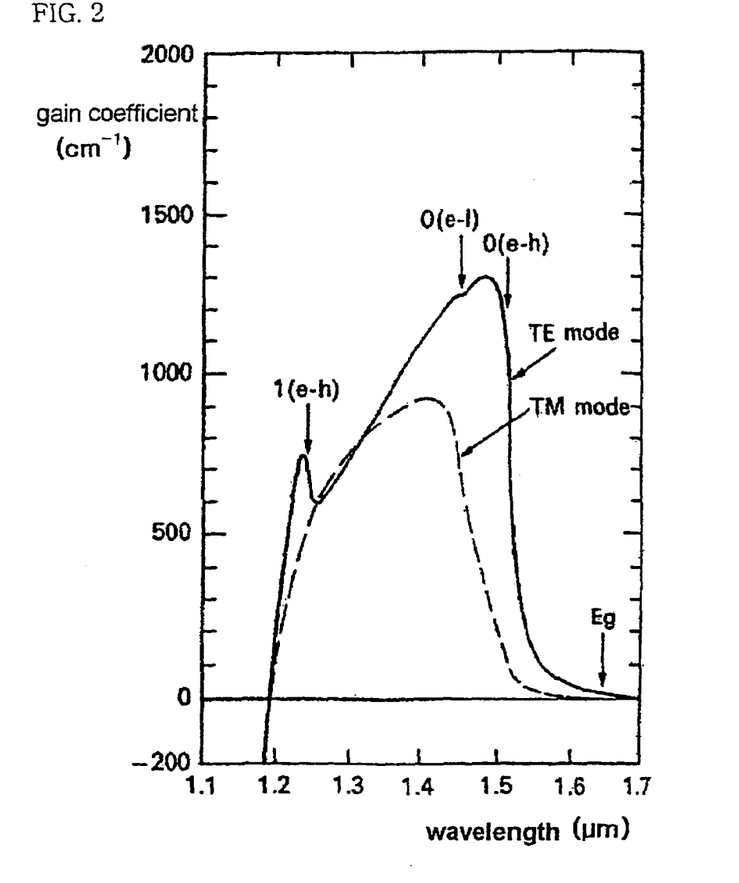
FIG. 2 is a measurement result view to show a polarization dependency according to a gain in the conventional semiconductor optical amplifier.

FIG. 1 is a cross-sectional view illustrating a conventional semiconductor optical amplifier having an active layer made of a quantum well, and FIG. 2 is a measurement result view to show a polarization dependency according to a gain in the conventional semiconductor optical amplifier.

As shown in FIG. 1, the conventional semiconductor optical amplifier includes a semiconductor substrate 10. A first conductive type clad layer 12, an active layer 14, is and a second conductive type clad layer 16 are stacked on the semiconductor substrate 10 in this order. The active layer 14 is made of a quantum well. A light signal represented by a left-side small arrow incident to one side of the conventional semiconductor amplifier is amplified while passing through a quantum well active layer 14 and then go out of the other side thereof.

However, the conventional semiconductor optical amplifier having the active layer 14 of the quantum well has a relatively small homogeneous broadening of a corresponding energy level. Therefore, in the case of the optical communication system which several adjacent wavelengths are amplified such as a WDM system, a gain interference between adjacent channels becomes severe and thus it is impossible to be put to practical use.

FIG. 2 is a resultant view of a gain spectrum according a polarization of an input light signal of the convention semiconductor optical amplifier.

As shown in FIG. 2, since the conventional semiconductor optical amplifier has a gain greatly depending on a polarization of an input light [M. Asada, A, Kameyama, and Y. Suematsu, "Gain and intervalence band absorption in quantum-well lasers", IEEE J. Quantum Electronics, QE-2, 745–753 (1984)], an optical transmission system that a polarization varies irregularly according to a time has a problem in that a size of a gain varies irregularly and thus is almost impossible to be used a practical system. Also, a system that several wavelengths are amplified at a time such as a WDM optical communication system is impossible to be used as an optical amplifier for a communication because a gain interference between channels is severe due to a large homogeneous broadening.

In recent, an optical communication of a WDM method that one optical fiber has a number of channels having different wavelengths has been introduced, and this makes a communication capacity increase.

Figure 3:
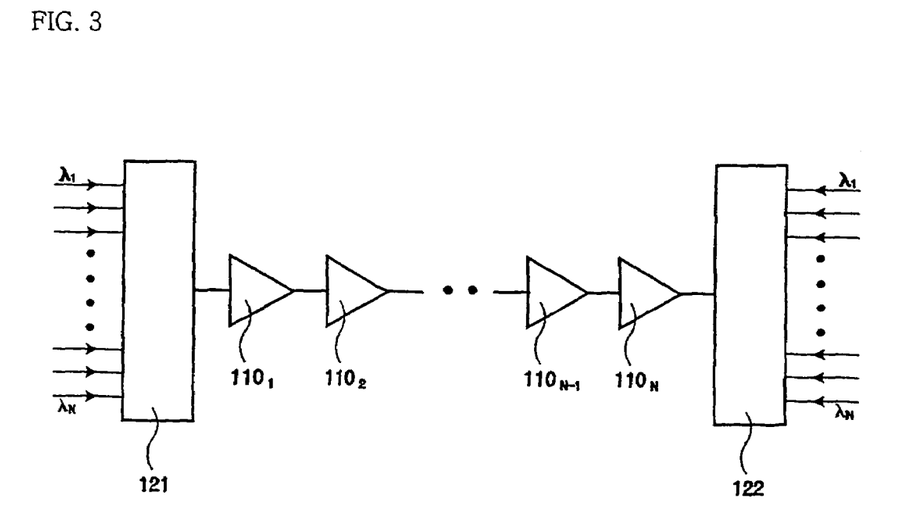
FIG. 3 is a configuration view of a conventional long-distance WDM optical communication.
Figure 4:
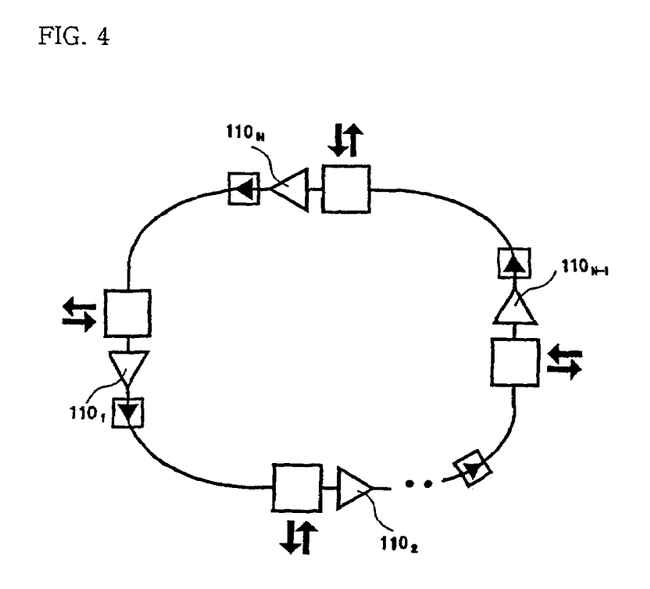
FIG. 4 is a configuration view of an optical transmission system of a conventional WDM network.

FIG. 3 is a configuration view of a conventional long-distance WDM optical communication, and FIG. 4 is a configuration view of an optical transmission system of a conventional WDM network.

As shown in FIGS. 3 and 4, in such a WDM system, several wavelengths are amplified at a time and several amplifiers $110_1$, $110_2$, . . . , $110_N$ are used. However, in this case, when gains to wavelengths are not identical, there occurs a problem in that a difference of a light intensity between channels becomes large at a last receiving end. That is, since there occurs a phenomenon that a gain at each wavelength is multiplied when it passes through several amplifiers $110_1$, $110_2$, . . . , $110_N$, even though at the beginning gains are approximate, a gain difference increase as much as the number of amplifiers through which it passes.

As shown in FIG. 4, in the case of the conventional WDM network, part of channels are added or dropped, and thus a channel number is varied, leading to a variation of input signal intensity. In the case of the conventional optical fiber amplifier, since a gain spectrum depends on an intensity of the input signal, an optical amplifier having a flatted gain has a problem in receiving signal since a signal intensity greatly depends on a channel and gains in remaining channels are also greatly varied.

Figure 5:
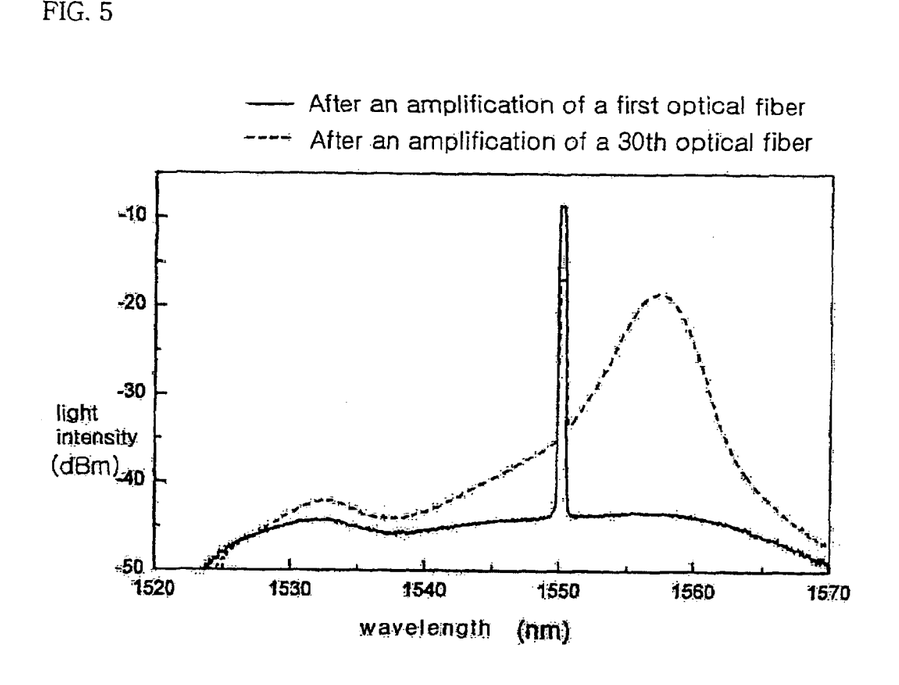
FIG. 5 is a view illustrating a gain spectrum measurement result in an optical transmission system connected to a convention erbium doped optical fiber amplifier.
Figure 6:
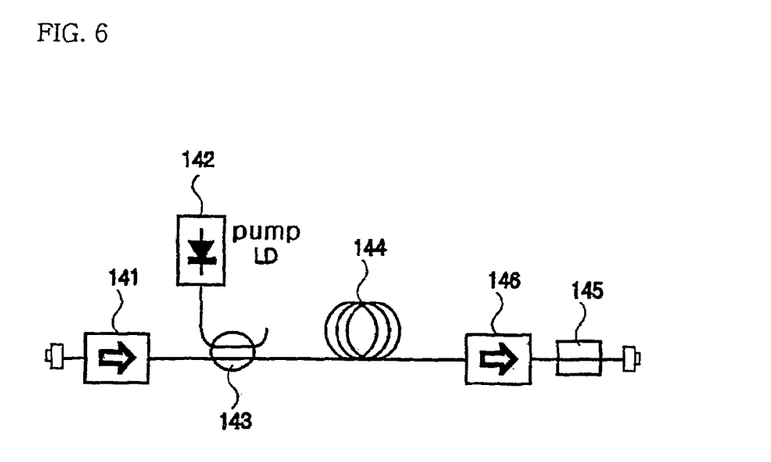
FIG. 6 is a configuration view of a conventional gain-flattening optical fiber amplifier.

FIG. 5 is a view illustrating a gain spectrum measurement result in an optical transmission system connected to a convention erbium doped optical fiber amplifier. In FIG. 5, a large signal of 1550 nm denotes an amplified input light, and a line laid over a wide region denotes a gain flatness. A curve A represents a gain result when one amplifier is used for amplification, and a curve B represents a gain result when 30 amplifiers are used for amplification. FIG. 5 shows a problem occurring when a signal light passes through several amplifiers $110_1$, $110_2$, . . . , $110_N$. That is, a gain difference in 1532 nm and 1557 nm is within 1 dB when it passes through one amplifier, while a gain difference is 24 dB when it passes through 30 amplifiers. That is, a signal light Such a feature occurs because the erbium doped optical fiber amplifier is large in tendency of a homogeneous broadening. FIG. 6 is a configuration view of a conventional gain-flattening optical fiber amplifier, and shows the optical amplifier which is designed to have a flat gain such that a gain-flattening filter 145 is inserted to permit an appropriate loss in order to overcome the problem.

In this case, however, it is very difficult to precisely adjust a gain in one amplifier. In addition, even though a gain difference is within 1 dB in one amplifier which have performed the gain adjustment, when it passes through several amplifiers, for example, 100 amplifiers, a gain difference of tens of dBs occurs. Also, when an intensity of an input signal or a channel number is varied, the optical amplifier having the gain-flattening filter 145 has a problem in that a gain flatness of a designed optical amplifier becomes bad.

The optical communication of the WDM method can put a large number of channels having different wavelengths in one optical fiber and thus can rapidly increase a communication capacity. Therefore, it can sent more signal amounts as a gain band is wider. It is expected that a current available band of an optical amplifier, i.e., 70 nm, is soon difficult to keep pace to a rapidly increasing communication capacity. Therefore, there is a need for an optical amplifier which can use all region of 1250 nm to 1650 nm which are a low absorption band of an optical fiber.

Figure 7:
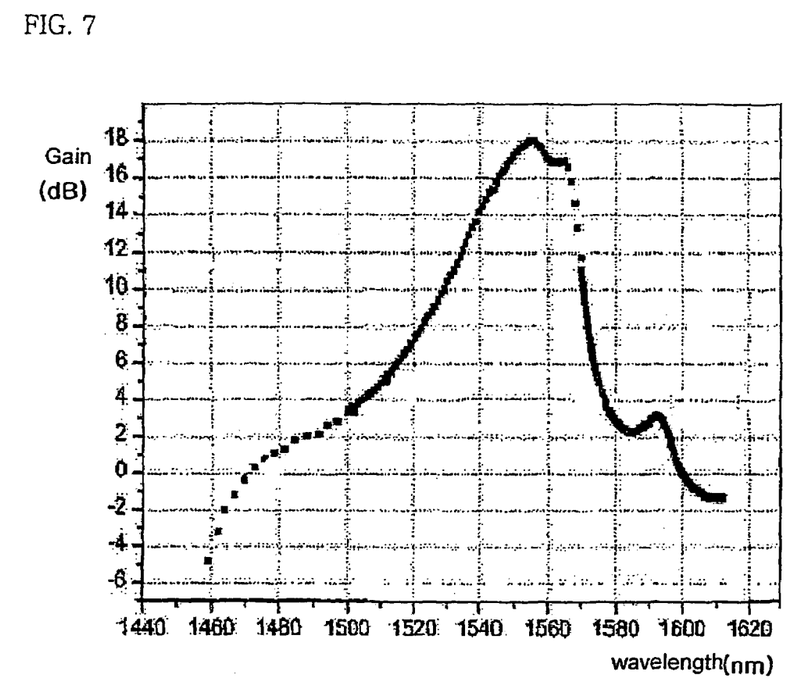
FIG. 7 is a view illustrating a gain spectrum result of a conventional Raman optical fiber amplifier.

FIG. 7 is a view illustrating a gain spectrum result of a conventional Raman optical fiber amplifier.

In order to solve the problems, the conventional Raman optical fiber amplifier use a non-linear phenomenon of an optical fiber to broaden an amplification band and is used to increase a communication capacity. The conventional Raman optical fiber amplifier requires an excitation light of about 1 W in a single mode optical fiber to obtain a sufficient gain, but such a light source is large in size and high in power consumption and thus is not of practical use. Also, an amplification band obtained from one light source is about 20 nm as shown in FIG. 7. Thus, a large number of high-power elements are additional required to obtain an amplification gain of a broad region and thus there are many difficult in using the system.

Besides, as a transmission capacity is increased, there is an expectation that an optical amplifier system of such a broad gain band is required in future. The optical amplifier system of such a broad gain band is necessarily required in a repeater for a long-distance transmission, a post-amplifier of a transmitting end, a pre-amplifier of a receiving end, and a metro WDM system.

SUMMARY OF THE INVENTION

It is an object of the present invention to provide a semiconductor quantum dot optical amplifier which forms a quantum dot active layer between clad layers and thus has no a polarization dependency and a signal leakage between channels but a broad gain band.

It is another object of the present invention to an optical amplifier module which has a feature suitable for a WDM optical communication system and has a is wide gain band including a wavelength band which could not be amplified by a conventional optical amplifier, and an optical transmission system which is formed by connecting several optical amplifiers using the optical amplifier module and that a gain flatness is automatically performed and a gain is automatically fixed in spite of a variation of channel.

In order to achieve the above object, the preferred embodiments of the present invention provide a semiconductor quantum dot optical amplifier for amplifying an optical signal, comprising: a semiconductor substrate being a basis forming the amplifier; a first conductive type clad layer formed on the semiconductor substrate and allowing conductive particles required to amplify the optical signal to pass; a quantum dot active layer formed close to an upper surface of the first conductive type clad layer and including layers of quantum dots amplifying the optical signal; and a second conductive type clad layer formed close to an upper surface of the quantum dot active layer and operating to correspond to the first conductive type clad layer to allow the conductive particles required for an amplification to pass.

The present invention further provides a semiconductor quantum dot optical amplifier module for amplifying an optical signal, comprising: a semiconductor quantum dot optical amplifier including: a semiconductor substrate; a first conductive type clad layer formed on an upper surface of the semiconductor substrate and allowing conductive particles required to amplify the optical signal to pass; a quantum dot active layer formed close to an upper surface of the first conductive type clad layer and including layers of quantum dots amplifying the incient optical signal; and a second conductive type clad layer formed close to an upper surface of the quantum dot active layer and operating to correspond to the first conductive type clad layer to is allow the conductive particles required for an amplification to pass; and an optical fiber for transferring the optical signal.

The present invention further provides a semiconductor quantum dot optical amplifier module for amplifying an optical signal, comprising: a first wavelength division multiplexer located in an input portion of the optical signal and dividing the optical signal into at least one wavelength band; at least one semiconductor quantum dot optical amplifier for amplifying the optical signal coupled and incident to a band divided from the first wavelength division multiplexer through an active operation of a semiconductor quantum dot; a second wavelength division multiplexer for coupling and outputting the optical signal amplified by the at least one semiconductor quantum dot optical amplifiers; and an optical fiber for coupling respective components of the respective optical amplifier modules to transfer the optical signal.

The present invention further provides an optical transmission system for transmitting optical signal, comprising: an input portion in which at least one different wavelength channel is coupled to one optical signal and output; an amplifying portion including at least one semiconductor quantum dot optical amplifier module arranged at a regular interval to receive the optical signal from the input portion and amplify the different wavelength channel; an output portion dividing the optical signal from the amplifying portion into at least channel of different wavelength; and a transmitting portion for coupling respective components of the optical transmission system to each other.

The present invention further provides an optical transmission system for transmitting an optical signal in a network, comprising: an amplifying portion including at least one semiconductor quantum dot optical amplifier module and amplifying the transmitted optical signal according a section; and an input/output portion performing a communication to receive/output the optical signal from/to an external portion.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

First, a semiconductor quantum dot optical amplifier is described in detail.

As described above, the conventional semiconductor optical amplifier has a gain greatly depending on a polarization state of a signal input to an amplifier and thus is difficult to be used in an optical communication system that a polarization varies in time. However, in case of the quantum dot optical amplifier, a polarization dependency based on a structure of an active medium does not occur because a carrier bound by an quantum dot that is an active layer is restricted in all directions. E. Hermann et al have measured a gain according to a polarization in a quantum dot laser and have revealed that there is no difference in a ground state of a quantum dot which is a major amplification band [E. Hermann et al, "Modal gain and internal optical mode loss of a quantum dot laser", Applied Physics Letters, 77, 163–165,2000].

Figure 8:
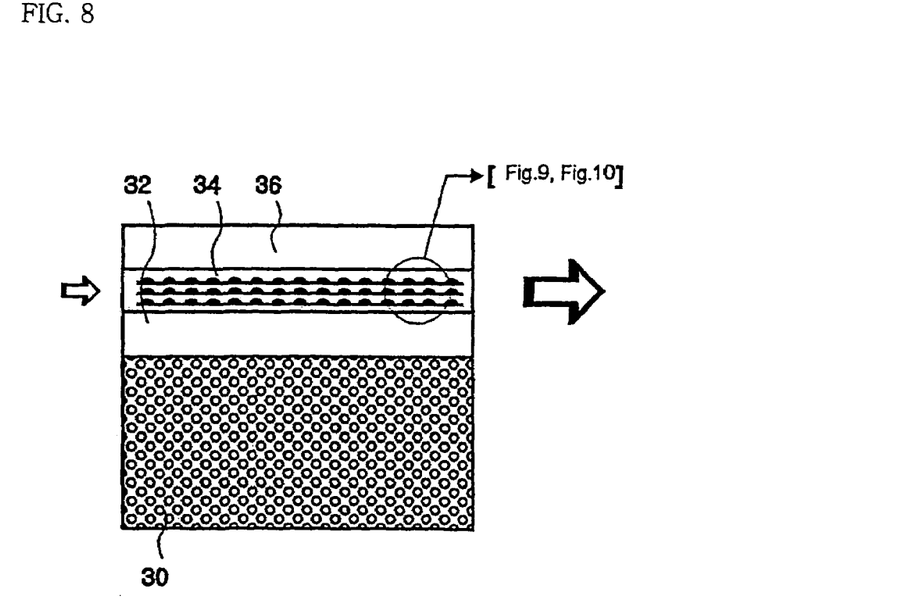
FIG. 8 is a cross-sectional view illustrating a semiconductor quantum dot optical amplifier according to one embodiment of the present invention.

FIG. 8 is a cross-sectional view illustrating a semiconductor quantum dot optical amplifier according to one embodiment of the present invention.

As shown in FIG. 8, the semiconductor quantum dot optical amplifier includes a first conductive type clad layer 32, a quantum dot active layer 34, and a second conductive type clad layer 36 which are stacked on a semiconductor substrate 30 in this order. A signal light irradiated from one side of the semiconductor quantum dot optical amplifier of the present invention is amplified in discontinuous energy levels constituting the quantum dot active layer 34 and then is emitted from the other side thereof.

The quantum dot active layer 34 can includes various layers of quantum dots. Energy levels of respective layers forming the quantum dot active layer 34 can be adjusted to be identical to or different from each other according to a use characteristic of the semiconductor quantum dot optical amplifier. A variation of such energy levels can be adjusted by adjusting a size of a quantum dot differently. Additionally, it is possible to deposit a barrier material having different energy gap between layers of the quantum dot active layer 34.

Figure 9:
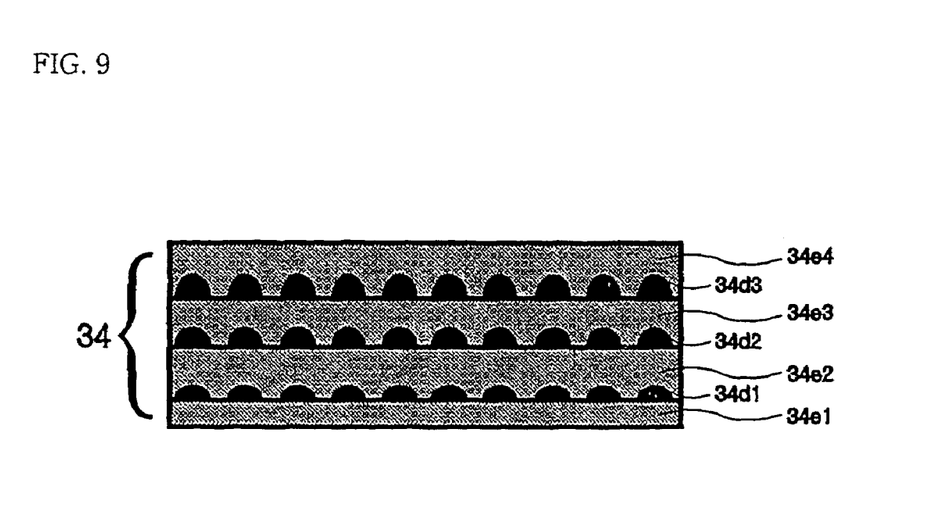
FIGS. 9 and 10 are examples of the active layers to increase a gain band of the semiconductor quantum dot optical amplifier-of the present invention.
Figure 10:
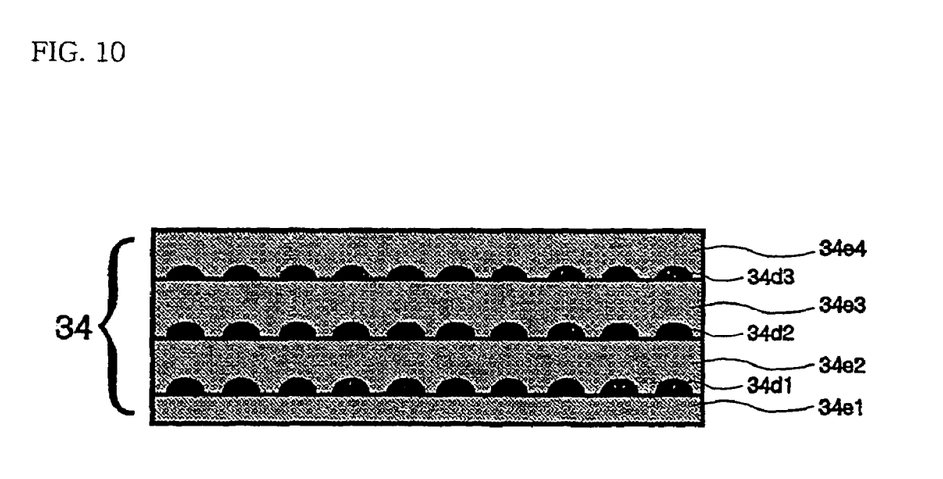

FIGS. 9 and 10 show examples of the active layer to increase a gain band of the semiconductor quantum dot optical amplifier according to the present invention. FIG. 9 is an example of the active layer formed by varying a size of quantum dots forming the quantum dot active layer 34. FIG. 10 is an example of the active layer formed by applying the barrier having different energy gaps.

Like FIGS. 9 and 10, a first epitaxial layer 34e1 is deposited on the first conductive type clad layer 32, and a first quantum dot layer 34d1 is deposited thereon. The quantum dot active layer 34 is formed such that epitaxial layers 34e2 to 34e4 and quantum dot layers 34d2 and 34d3 are deposited alternately. In this procedure, as shown in FIG. 9, it is possible to form the active layer 34 by adjusting a size of quantum dots differently.

Hereinafter, various modifications of the quantum dot active layer are described.

A first modification of the quantum dot active layer 34 according to the present invention is as follows. The semiconductor substrate 30 is made of GaAs, and then the first conductive type clad layer is made of a GaAs-based material.

The quantum dot active layer 34 in the center is formed by repeatedly performing an Al(x)Ga(1-x)As epitaxial process using AlGaAs, In(y)Ga(1-y)As quantum dot layers 34d1 to 34d3 using InGaAs, and an Al(z)Ga(1-z)As epitaxial process using AlGaAs. Therefore, the epitaxial layers 34e1 to 34e4 are formed by the Al(x)Ga(1-x)As epitaxial process and the Al(z)Ga(1-z)As epitaxial process. At this point, a value of x and z ranges from 0 to 1, and a value of y ranges from about 0.4 to 1. When an x value and a y value are equal, the epitaxial layers 34e1 to 34e4 have the same effect as formed by a single material, i.e., AlGaAs material. However, since the epitaxial layers 34e1 to 34e4 become a barrier, an amplification characteristic of various structures can be obtained by varying x and y values. In such a material composition, x, y and z values are constants determining a composition of a material.

A second modification of the quantum dot active layer 34 according to the present invention is as follows. Like the first modification, the semiconductor substrate 30 is made of GaAs.

The quantum dot active layer 34 is formed by repeatedly performing an In(x)Ga(1-x)As epitaxial process using InGaAs, In(y)Ga(1-y)As quantum dot layers 34d1 to 34d3 using InGaAs, and an In(z)Ga(1-z)As epitaxial process using InGaAs. At this point, x and z values range from 0 to 0.5, and a y value ranges from about 0.4 to 1. Therefore, epitaxial layers 34e1 to 34e4 are formed by In(x)Ga(1-x)As and In(y)Ga(1-y)As epitaxial processes. An energy level of the In(y)Ga(1-y)As quantum dot layers 34d1 to 34d3 is smaller than an energy gap of the epitaxial layers 34e1 to 34e4 formed by the In(x)Ga(1-x)As and In(y)Ga(1-y)As epitaxial processes.

A third modification of quantum dot active layer 34 according to the present invention is as follows. The semiconductor substrate 30 is made of InP. The quantum dot layer 34 is formed by repeatedly performing an epitaxial process using InGaAsP, In(y)Ga(1-y)As quantum dot layers 34d1 to 34d3 using InGaAs, and an epitaxial layer using InGaAsP. At this point, a y value ranges about 0.4 to 1. Therefore, the epitaxial layers 34e1 to 34e4 are formed by the epitaxial process using InGaAsP.

Here, a lattice constant of the epitaxial layer using InGaAsP is within about ±0.5% of a lattice constant of the InP semiconductor substrate. An energy level of the In(y)Ga(1-y)As quantum dot layers 34d1 to 34d3 is smaller than an energy gap of the epitaxial layers 34e1 to 34e4 using InGaAsP.

A fourth modification of the quantum dot active layer 34 according to the present invention is as follows. Like the third modification, the semiconductor substrate 30 is made of InP. The quantum dot layer 34 is formed by repeatedly performing an epitaxial process using InAlGaAs, In(y)Ga(1-y)As quantum dot layers 34d1 to 34d3 using InGaAs, and an epitaxial layer using InAlGaAs. At this point, a y value ranges about 0.4 to 1. Therefore, the epitaxial layers 34e1 to 34e4 are formed by the epitaxial process using InAlGaAs.

Here, a lattice constant of the epitaxial layer using InAlGaAs is within about ±0.5% of a lattice constant of the InP semiconductor substrate. An energy level of the In(y)Ga(1-y)As quantum dot layers 34d1 to 34d3 is smaller than an energy gap of the epitaxial layers 34e1 to 34e4 using InGaAsP.

The semiconductor quantum dot according to the present invention shows a characteristic that a homogeneous broadening is reduced due to a discontinuousness of an energy level. Therefore, even in case that a distance between adjacent channels is very small such as a high density WDM optical communication system, a signal leakage does not occur, whereupon the problems of the conventional semiconductor optical amplifier can be solved.

According to a latest report, the In(Ga)As quantum dot which uses a substrate made of GaAs in a light emitting region of the quantum dot less than 1.3 μm [G. Park et al, "Room-temperature Continuous-wave operation of a single-layered 1.3 μm quantum dot laser", Appl. Phys. Lett. 75, 3267–3269 (1999), U. H. Lee et al, "optical characteristics of self-assembled InAs/GaAs quantum dots at various temperatures and excitations", J. Korean Phys. Soc. 37,00 593–597 (2000)] and the InAs quantum dot which uses a substrate made of InP in a light emitting region of the quantum dot more than 1.3 μm [W. G. Jeong et al., "Epitaxial growth and optical characterization of InAs/InGaAsP/InP self-assembled quantum dots", Appl. Phys. Lett. 79, 1171–1173 (2001)] have already been announced.

The optical amplifiers which are mainly used in a current optical communication system include the erbium doped optical fiber amplifier. A gain band of the erbium doped optical fiber amplifier is a maximum 80 nm from 1525 nm to 1605 nm. In this interval, few amplifiers can be used in an actual system. However, the semiconductor quantum dot optical amplifier of the present invention can have a gain in an entire available region of the optical fiber by varying a quantum dot size or a barrier material surrounding the quantum dot.

Figure 11:
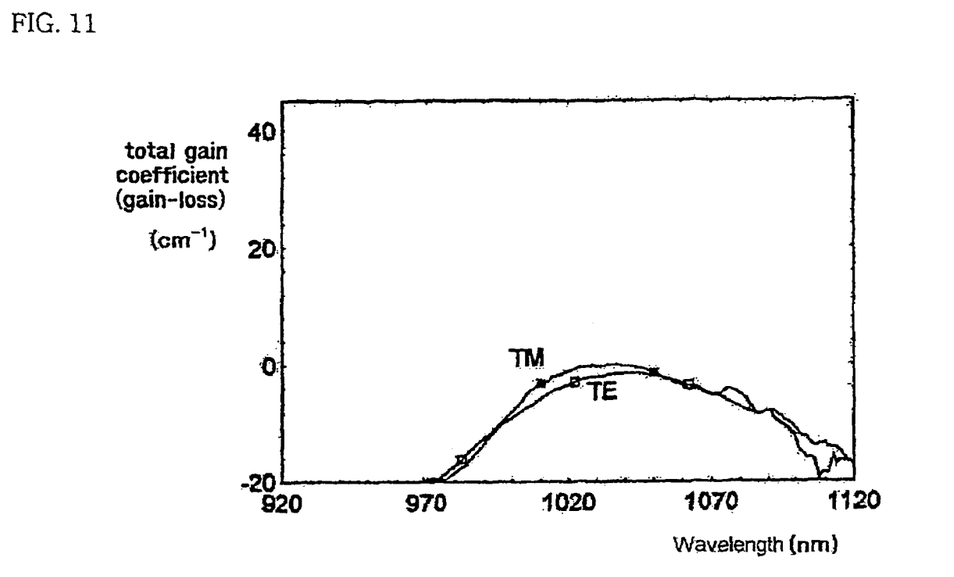
FIG. 11 is a view illustrating a polarization dependency to a gain in the semiconductor quantum dot optical amplifier of FIG. 8.
Figure 12:
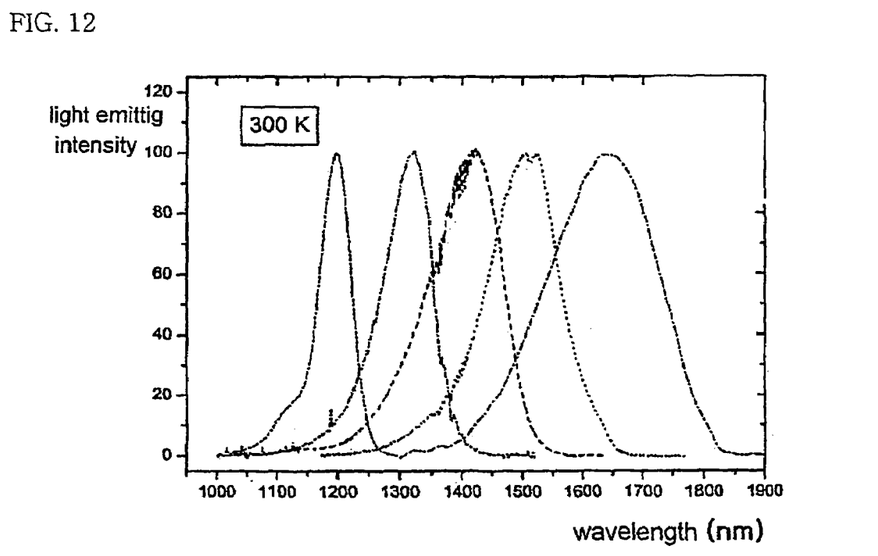
FIG. 12 is a view illustrating a spectrum measurement result of the light emitting intensity according to a wavelength of the semiconductor quantum dots

FIG. 11 is a view illustrating a polarization dependency to a gain in the semiconductor quantum dot optical amplifier of FIG. 8, and FIG. 12 is a view illustrating a spectrum-measurement result of the light emitting intensity according to a wavelength of the semiconductor quantum dots. In FIG. 11, an x-axis denote a wavelength (nm), a y-axis denotes a total gain coefficient ($cm^{-1}$) obtained form what a pure gain minus a waveguide loss. In FIG. 12, an x-axis denotes a wavelength (nm), and a y-axis denotes a light emitting intensity.

In the case of the semiconductor quantum dot optical amplifier of the present invention, an electron is restricted to all directions in a plurality of quantum dots. Therefore, as shown in FIG. 11, there is no polarization dependency, and a homogeneous broadening is poor, so that when it is applied to the high density WDM optical communication system, a signal leakage between adjacent channels does not occur.

Additionally, the semiconductor quantum dot optical amplifier is formed to have a gain in an entire available region of the optical fiber. As seen in FIG. 12, a quantum dot light emitting region is uniformly distributed in a region of less about 1.2 μm but more than about 1.6 μm which is usually used in the optical communication.

The semiconductor quantum dot optical amplifier of the present invention is a semiconductor element, and thus is very small in volume and is convenient to easy. Also, its power consumption is low due to a small threshold current which is a state density characteristic of the quantum dot. Additionally, it is economical in cost and shows a good characteristic even in non-available wavelength band of the conventional optical fiber amplifier.

The semiconductor quantum dot optical amplifier of the present invention can grow a plurality of quantum dots in a quantum dot active layer so as to greatly increase a gain. Besides, as described above, the semiconductor quantum dot optical amplifier of the present invention can be formed in various structures based on a technical concept of the present invention which can form various quantum dot layers by varying a semiconductor material.

A semiconductor quantum dot amplifier module and optical transmission system using the semiconductor quantum dot optical amplifier will be described below.

As described above, FIG. 8 shows a structure of the semiconductor quantum dot optical amplifier used in the semiconductor quantum dot optical amplifier module and optical transmission system, and FIGS. 11 and 12 show the gain spectrum result according to an input polarization in the semiconductor quantum dot optical amplifier.

That is, like FIG. 8, the signal light irradiated from one side of the semiconductor quantum dot optical amplifier is amplifier in discontinuous energy levels of the quantum dot active layer 34 and is emitted to the other side thereof.

The quantum dot active layer 34, as shown, can include multiple layers of quantum dots. The energy levels of the respective layers of the quantum dot active layer 34 can be adjusted to be identical to or different from each other according to a use characteristic of the semiconductor quantum dot optical amplifier of the present invention. Such energy level variation can be formed by varying a quantum dot size or by depositing a barrier material having different energy gaps between layers of the quantum dot active layer 34.

The semiconductor quantum dot optical amplifier, as shown in FIG. 11, can solve a polarization dependency of a gain which is a problem of the conventional semiconductor optical amplifier by using the active layer providing an amplification gain as the semiconductor quantum dot. That is, it can be understood that two gain characteristic curves of light signals incident to the semiconductor quantum dot optical amplifier from different directions show the almost same gain over a wavelength region.

Also, the semiconductor quantum dot optical amplifier of the present invention can solve a signal leakage between adjacent channels by using the active layer providing an amplification gain as the semiconductor quantum dot. In the case of the conventional semiconductor optical amplifier using the quantum well structure as the active layer, a homogeneous broadening of an associated energy level is relatively large, and so, due to a signal leakage representing a severe gain interference between adjacent channels, it has not been used in the optical communication system that several adjacent wavelengths are amplified together such as the WDM system. However, in the case of the semiconductor quantum dot, the homogeneous broadening is sufficiently reduced due to a discontinuousness of the energy level, and even when an interval between adjacent channels is very short such as the high density WDM optical communication system, the signal leakage does not occur, thereby solving the problems of the conventional semiconductor optical amplifier.

Figure 13A:
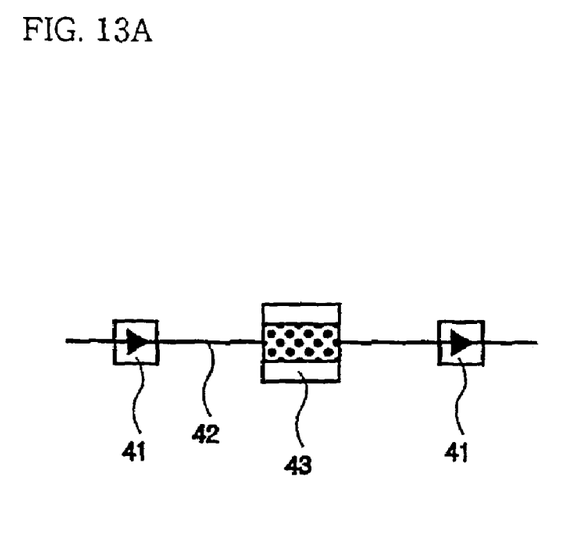
FIGS. 13A to 13E are views to describe a structure of the semiconductor optical amplifier model using the semiconductor quantum dot optical amplifier of FIG. 7.
Figure 13B:
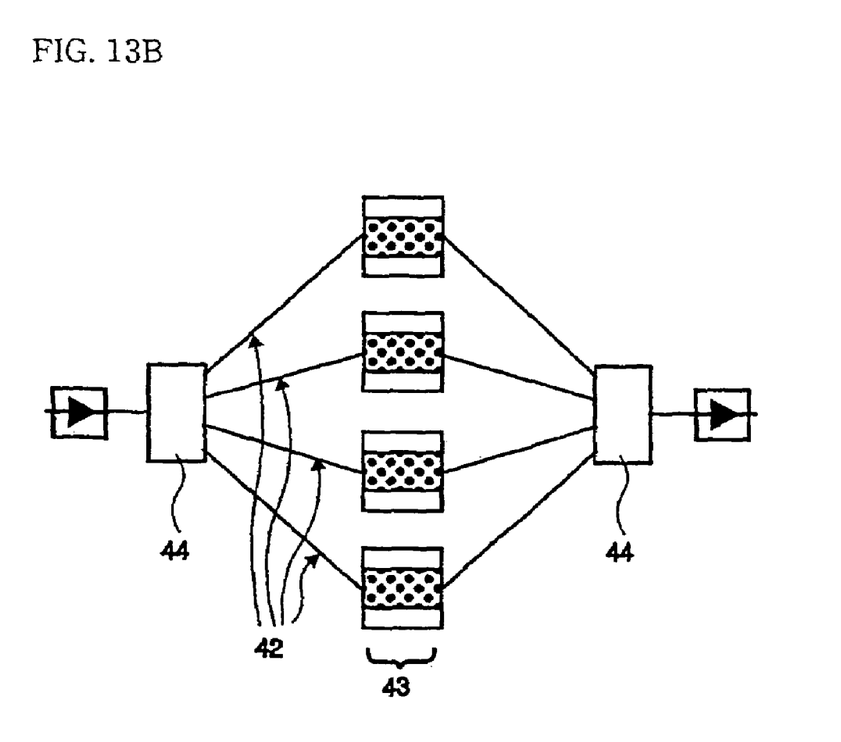
Figure 13C:
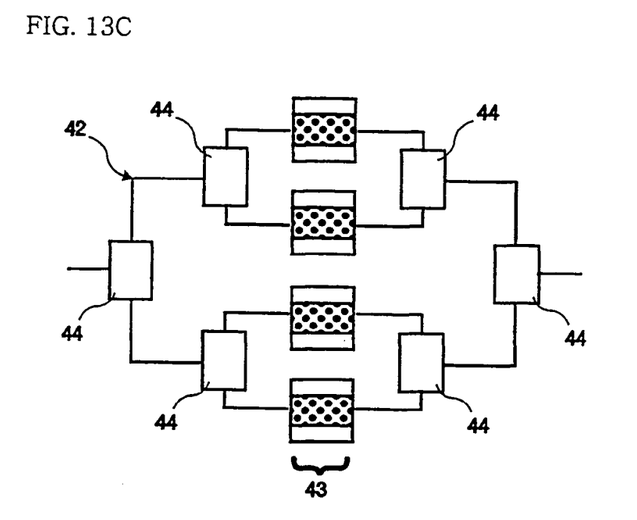
Figure 13D:
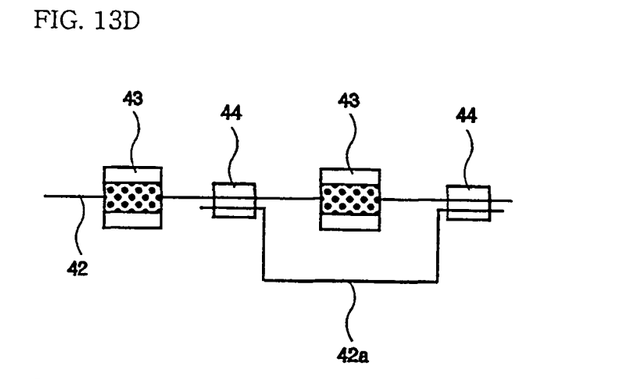
Figure 13E:
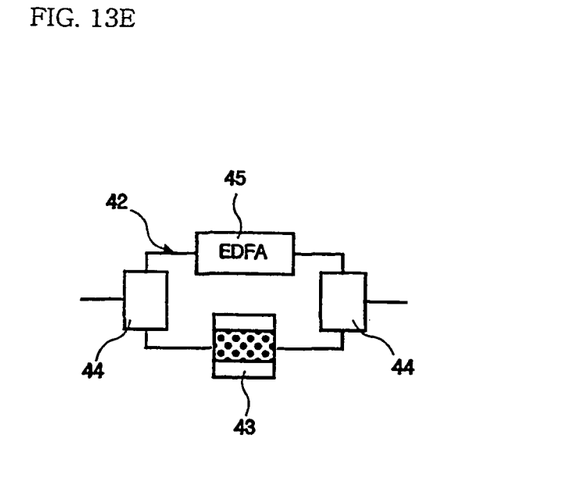

FIGS. 13A to 13E are views to describe a structure of the semiconductor optical amplifier module using the semiconductor quantum dot optical amplifier. FIG. 13A shows a single type, FIG. 13B shows a parallel type, FIG. 13C shows a complex parallel type, FIG. 13D shows a serial type, and FIG. 13E shows a parallel coupling type coupled to the conventional optical amplifier.

First, as shown in FIG. 13A, the single type semiconductor optical amplifier module includes two isolators 41, an optical fiber 42, and a semiconductor quantum dot optical amplifier 43. In the single type semiconductor optical amplifier module, one isolator is located at an incident portion of a signal light, and the optical fiber is arranged in an intermediate connection passage. The incident light signal is amplified in the semiconductor quantum dot optical amplifier, and is emitted through the other isolator 41.

The single type semiconductor optical amplifier module of FIG. 13A can make a gain in an entire available region of the optical fiber by varying a quantum dot size or a barrier material surrounding a quantum dot in the semiconductor quantum dot optical amplifier. According to a latest report, the In(Ga)As quantum dot which uses a is substrate made of GaAs in a light emitting region of the quantum dot less than 1.3 82 m [G. Park et al, "Room-temperature Continuous-wave operation of a single-layered 1.3 µm quantum dot laser", Appl. Phys. Lett. 75, 3267–3269 (1999), U. H. Lee et al, "optical characteristics of self-assembled InAs/GaAs quantum dots at various temperatures and excitations". J. Korean Phys. Soc. 37,00 593–597 (2000)] and the InAs quantum dot which uses a substrate made of InP in a light emitting region of the quantum dot more than 1.3 µm [W. G Jeong et al., "Epitaxial growth and optical characterization of InAs/InGaAsP/InP self-assembled quantum dots", Appl. Phys. Lett. 78, 1171–1173 (2001)] have already been announced.

The parallel type semiconductor quantum dot optical amplifier module of FIG. 13B includes two wavelength division multiplexers 44 located at both an incident portion and an emitting portion of a light signal and semiconductor quantum dot optical amplifiers 43 coupled in parallel.

The complex parallel type semiconductor quantum dot optical amplifier module of FIG. 13C includes wavelength division multiplexers 44 located complexly, and semiconductor quantum dot optical amplifiers 43 coupled to the wavelength division multiplexers 44 in parallel.

The serial type semiconductor quantum dot optical amplifier module of FIG. 13D includes semiconductor quantum dot optical amplifiers 43 arranged in serial. Here, a signal of a short wavelength band is amplified in the front semiconductor quantum dot optical amplifier 43 not to pass through the semiconductor quantum dot optical amplifier 43 where a signal of a lengthy wavelength band is amplified.

The parallel coupling type semiconductor quantum dot optical amplifier module of FIG. 3E shows the semiconductor quantum dot optical amplifier module coupled to the conventional optical amplifier.

The semiconductor quantum dot optical amplifier modules described above can be designed to have a sufficient gain in a wide region of from about 1.2 µm to about 1.7 µm where a loss of the optical fiber is sufficiently low. Additionally, the semiconductor quantum dot optical amplifier module of the present invention uses the semiconductor quantum dot optical amplifier, and thus it has various advantages in that a volume is small and power consumption is low due to a low threshold current.

Figure 14:
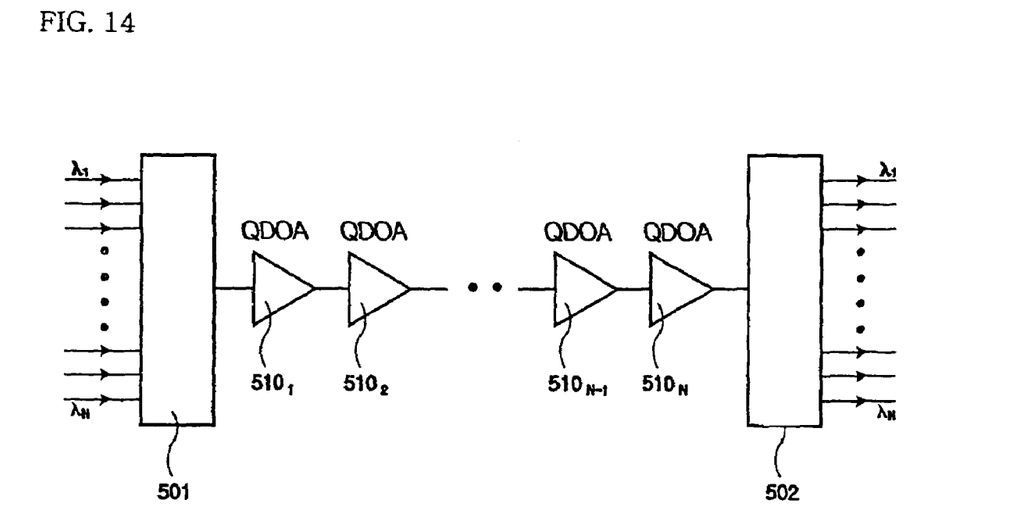
FIG. 14 is a block diagram illustrating an optical transmission system using the semiconductor quantum dot optical amplifier module according to the present invention.

FIG. 14 is a block diagram illustrating an optical transmission system using the semiconductor quantum dot optical amplifier module according to the present invention.

As shown, the optical transmission system of the present invention includes first and second wavelength division multiplexers 501 and 502 located as an input portion and an output portion, respectively, and a plurality of semiconductor quantum dot optical amplifier modules QDOA $510_1$ to $510_N$ arranged as an amplifying portion therebetween. Therefore, when a light signal of a wide wavelength band is irradiated to the first wavelength division multiplexer 501, it is amplified in the intermediate semiconductor quantum dot optical amplifier modules QDOA $510_1$ to $510_N$ by an amount necessary in transmission. The first light signal is coupled and transmitted by the first wavelength division multiplexer 501 of the input portion and then is divided into a plurality of wavelength signals by the second wavelength division multiplexer 502 of the output portion. In the semiconductor quantum dot optical amplifier module of the present invention, the signals of the respective components are transmitted by the transmitting portion naming generically the optical fiber.

The optical transmission system of the present invention uses the semiconductor quantum dot optical amplifier module having a strong inhomogeneous broadening characteristic, and so a spectrum variation of a gain appears differently while passing through several amplifiers.

Figure 15:
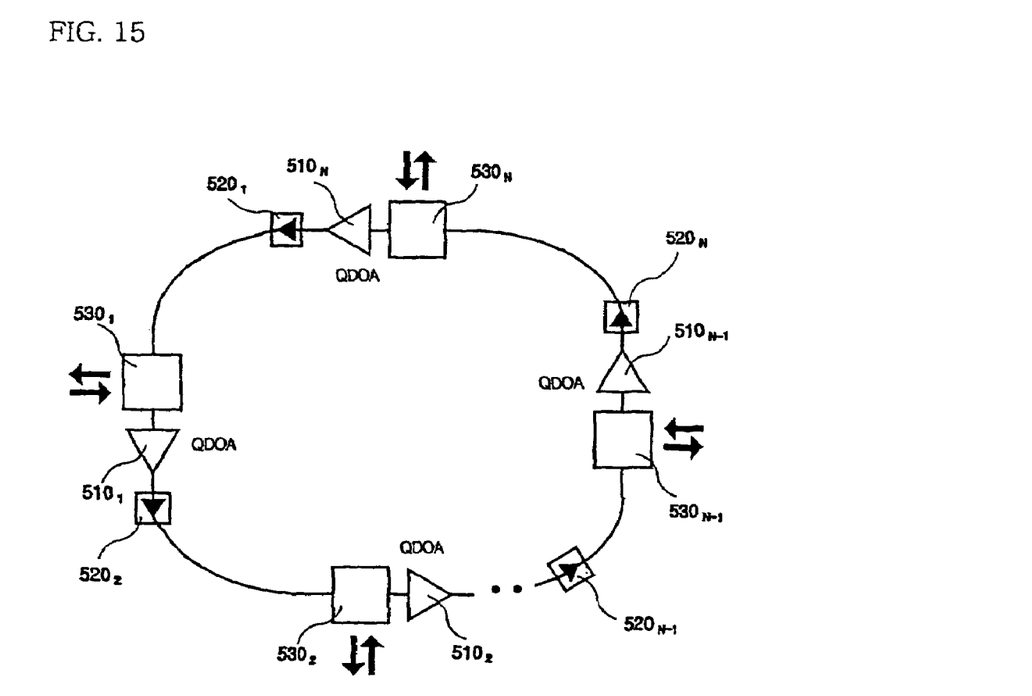
FIG. 15 is a configuration view illustrating the optical transmission system using the semiconductor quantum dot optical amplifier module in a WDM network according to the present invention.

FIG. 15 is a configuration view illustrating the optical transmission system using the semiconductor quantum dot optical amplifier module in a WDM network according to the present invention.

As shown, the optical transmission system using the semiconductor quantum dot optical amplifier module includes a plurality of semiconductor quantum dot optical amplifier modules QDOA $510_1$ to $510_N$, a plurality of isolators $520_1$ to $520_N$, and a plurality of multiplexers $530_1$ to $530_N$.

A plurality of semiconductor quantum dot optical amplifier modules QDOA $510_1$ to $510_N$ forming the amplifying portion includes the semiconductor quantum dot optical amplifier and so performs a function amplifying a transferred light signal in section. A plurality of isolators $520_1$ to $520_N$ are divided according to a section to constitute a node to transmit a light signal, thereby forming a node portion. A plurality of multiplexers $530_1$ to $530_N$ constitutes an input and output portion to externally connect the optical transmission system in the WDM network.

The optical transmission system includes the semiconductor quantum dot optical amplifier modules and thus, even though it passes through several optical amplifier modules, a gain flatness is maintained, and a channel gain is fixed.

The isolators 41, and $520_1$ to $520_N$ cannot be used according to a characteristic and a need of the optical transmission system.

Figure 16:
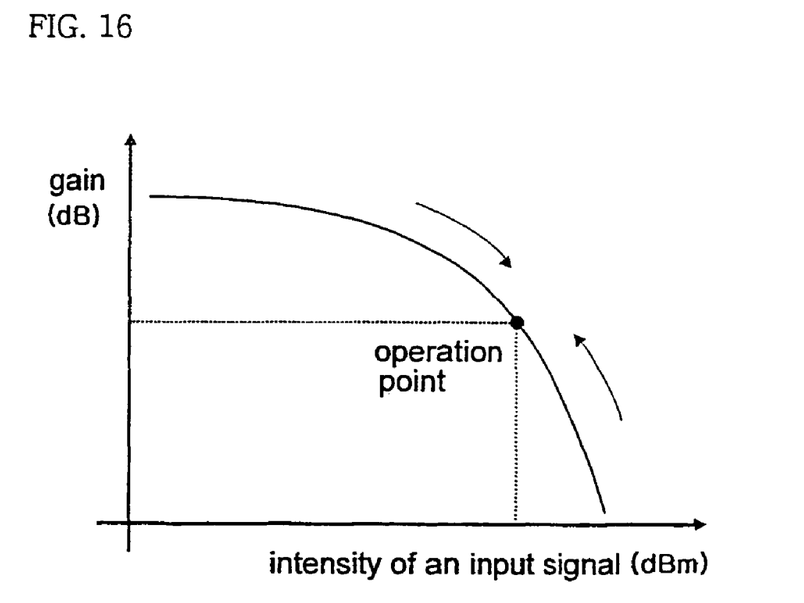
FIG. 16 is a view illustrating an operation characteristic in each channel of the optical transmission system.

FIG. 16 is a view illustrating an operation characteristic in each channel of the optical transmission system.

While the invention has been particularly shown and described with reference to preferred embodiments thereof, it will be understood by those skilled in the art that the foregoing and other changes in form and details may be made therein without departing from the spirit and scope of the invention.

In such an optical transmission system, a plurality of amplifiers are connected to be used, and so the almost same effect as a laser can be obtained,. An oscillation condition of a laser has a characteristic that a saturation gain value is identical to a loss value. The amplifier of the inventive optical transmission system is operated such that a saturation gain value becomes identical to a section loss value. Therefore, the optical transmission system of the present invention shows a flat gain and thus, shows a characteristic that a gain seems fixed and operates in a stable state.

Figure 17:
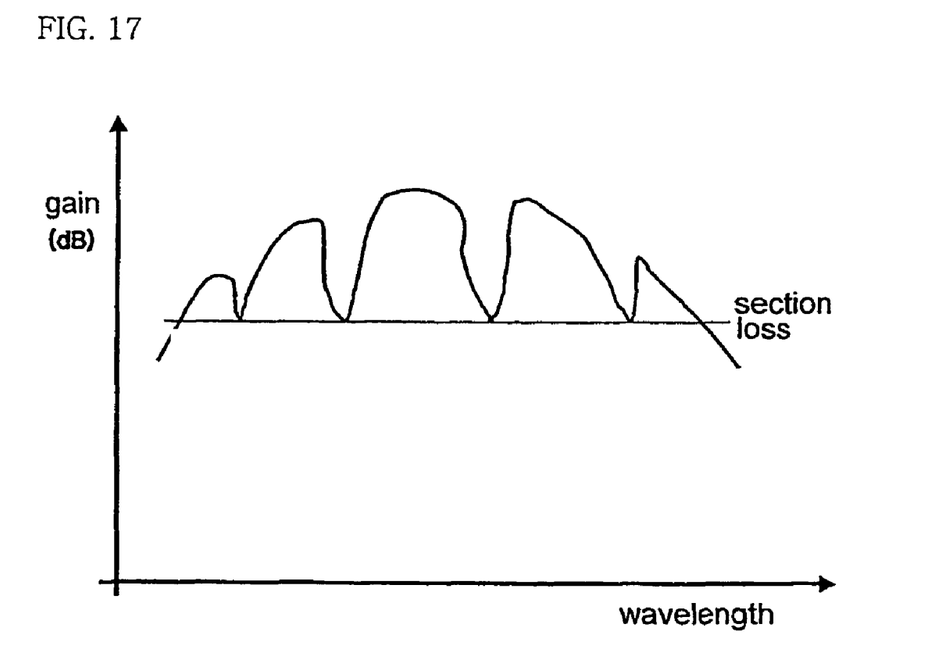
FIG. 17 is a view illustrating a gain spectrum of the optical transmission system of the present invention.

FIG. 17 is a view illustrating a gain spectrum of the optical transmission system of the present invention.

As shown, the optical transmission system of the present invention shows a hole burning phenomenon that a gain becomes smaller locally. Therefore, due to such a hole burning phenomenon, as a light intensity is larger as shown in FIG. 16, the hole burning becomes larger, whereby an increasing ratio of a signal is reduced. Such a phenomenon shows the same trend in a different wavelength, and so an amplification gain in all used wavelengths becomes close to the same section loss. In this case, when it passes through first several amplifiers, a light intensity becomes stronger in a wavelength of a high gain. But, even though it passes through a number of the amplifiers thereafter, since it has the same gain in all channels, a difference of a signal intensity according to a wavelength does not become large any more.

Due to a remarkable effect of the optical transmission system of the present invention, a difference of a signal intensity within several dBs generated in a receiving end does not matter. Therefore, a very severe gain unbalance problem in a long distance transmission system can be solved simply even by a simple method of connecting the semiconductor quantum dot optical amplifier.

In the case of the WDM network, since part of channels are added or dropped, there may occur problems in that an intensity of the input signal can be varied and losses in the respective sections are not constant. However, the optical transmission system of the present invention uses the semiconductor quantum dot optical amplifier module having a strong inhomogeneous broadening, problems resulting from an add/drop of channel and a section loss variation can be solved.

The optical amplifier having an inhomogeneous broadening has the almost same gain spectrum when an excitation energy given in the optical amplifier is constant. Therefore, even though a total input signal is reduced due to a drop of several channels, it does not affect a gain or an output of a different channel. Also, even though there is a section loss variation, since a gain is automatically adjusted in each wavelength as shown in FIG. 16, an output intensity and a flatness are maintained. As described above, when it is used by connecting the semiconductor quantum dot optical amplifier module without using any other complicated method, a gain and an output are fixed and so a difficult problem is simply solved, thereby simplifying the WDM optical communication system.

Since the semiconductor quantum dot optical amplifier module of the present invention has a strong inhomogeneous broadening, in the optical transmission system in which the optical amplifier is used several times, an excellent characteristic is shown in size, power consumption, and available band as well as a gain flatness, a gain fixation, and a signal leakage.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor quantum dot optical amplifier for amplifying an optical signal, comprising:
    a semiconductor substrate made of GaAs;
    a first conductive type clad layer formed on the semiconductor substrate and allowing conductive particles required to amplify the optical signal to pass;
    a quantum dot active layer formed close to an upper surface of the first conductive type clad layer and including layers of quantum dots amplifying the optical signal; and
    a second conductive type clad layer formed close to an upper surface of the quantum dot active layer and operating to correspond to the first conductive type clad layer to allow the conductive particles required for an amplification to pass;
    wherein the active layer is formed by repeatedly performing an In(x)Ga(1-x)As epitaxial process using InGaAs, an In(y)Ga(1-y)As quantum dot using InGaAs, and an In(z)Ga(1-z)As epitaxial process using InGaAs, where x and z values range from 0 to 0.5, and a y value ranges from about 0.4 to 1.

2. The amplifier of claim 1, wherein the quantum dot active layer is formed such that semiconductor quantum dots forming the quantum dot active layer forms a discontinuous energy level.

3. The amplifier of claim 1, wherein the quantum dot active layer includes a plurality of quantum dot layers.

4. The amplifier of claim 3, wherein the plurality of quantum dot layers are formed such that energy levels of the respective layers are same.

5. The amplifier of claim 3, wherein the plurality of quantum dot layers are formed such that energy levels of the respective layers are different.

6. The amplifier of claim 5, wherein the plurality of quantum dot layers vary an energy level by varying a size of the quantum dots forming the quantum dot layers.

7. The amplifier of 5, wherein the plurality of quantum dot layers vary an energy level by forming a barrier of different energy gaps in upper and lower portions of the quantum dot layers.

8. The amplifier of claim 1, wherein an energy level of the In(y)Ga(1-y)As quantum dot layer is smaller than an energy gap of the epitaxial layer by the epitaxial process.

9. A semiconductor quantum dot optical amplifier for amplifying an optical signal, comprising:
- a semiconductor substrate made of InP;
- a first conductive type clad layer formed on the semiconductor substrate and allowing conductive particles required to amplify the optical signal to pass;
- a quantum dot active layer formed close to an upper surface of the first conductive type clad layer and including layers of quantum dots amplifying the optical signal; and
- a second conductive type clad layer formed close to an upper surface of the quantum dot active layer and operating to correspond to the first conductive type clad layer to allow the conductive particles required for an amplification to pass;
- wherein the active layer is formed by repeatedly performing an epitaxial process using InGaAsP, an In(y)Ga(1-y)As quantum dot using InGaAs, and an epitaxial process using InGaAs, where a y value ranges from about 0.4 to 1.

10. The amplifier of claim 9, wherein a lattice constant of the epitaxial layer by the InGaAsP epitaxial process is within ±0.5% of a lattice constant of the InP semiconductor substrate.

11. The amplifier of claim 9, wherein an energy level of the In (y)Ga(1-y)As quantum dot layer is smaller than an energy gap of the epitaxial layer by the epitaxial process.

12. A semiconductor quantum dot optical amplifier for amplifying an optical signal, comprising:
- a semiconductor substrate made of InP;
- a first conductive type clad layer formed on the semiconductor substrate and allowing conductive particles required to amplify the optical signal to pass;
- a quantum dot active layer formed close to an upper surface of the first conductive type clad layer and including layers of quantum dots amplifying the optical signal; and
- a second conductive type clad layer formed close to an upper surface of the quantum dot active layer and operating to correspond to the first conductive type clad layer to allow the conductive particles required for an amplification to pass;
- wherein the active layer is formed by repeatedly performing an epitaxial process using InAlGaAs, an In(y)Ga(1-y)As quantum dot using InGaAs, and an epitaxial process using InAlGaAs, where a y value ranges from about 0.4 to 1.

13. The amplifier of claim 12, wherein a lattice constant of the epitaxial layer by the InAlGaAs epitaxial process is within ±0.5% of a lattice constant of the InP semiconductor substrate.

14. The amplifier of claim 12, wherein an energy level of the In (y)Ga(1-y)As quantum dot layer is smaller than an energy gap of the epitaxial layer by the epitaxial process.

15. A semiconductor quantum dot optical amplifier module for amplifying an optical signal, comprising: a semiconductor quantum dot optical amplifier and an optical fiber for transferring the optical signal;
- wherein the semiconductor quantum dot optical amplifier includes
- a semiconductor substrate made of GaAs;
- a first conductive type clad layer formed on an upper surface of the semiconductor substrate and allowing conductive particles required to amplify the optical signal to pass;
- a quantum dot active layer formed close to an upper surface of the first conductive type clad layer and including layers of quantum dots amplifying the incident optical signal; and
- a second conductive type clad layer formed close to an upper surface of the quantum dot active layer and operating to correspond to the first conductive type clad layer to allow the conductive particles required for an amplification to pass;
- wherein the active layer is formed by repeatedly performing an In(x)Ga(1-x)As epitaxial process using InGaAs, an In(y)Ga(1-y)As quantum dot using InGaAs, and an In(z)Ga(1-z)As epitaxial process using InGaAs, where x and z values range from 0 to 0.5, and a y value ranges from about 0.4 to 1.

16. A semiconductor quantum dot optical amplifier module for amplifying an optical signal, comprising:
- a first wavelength division multiplexer located in an input portion of the optical signal and dividing the optical signal into at least one wavelength band;
- at least one semiconductor quantum dot optical amplifier for amplifying the optical signal coupled and incident to a band divided from the first wavelength division multiplexer through an active operation of a semiconductor quantum dot;
- a second wavelength division multiplexer for coupling and outputting the optical signal amplified by the at least one semiconductor quantum dot optical amplifiers; and
- an optical fiber for coupling respective components of the respective optical amplifier modules to transfer the optical signal;
- wherein the semiconductor quantum dot optical amplifier comprises
  - a semiconductor substrate made of GaAs,
  - a first conductive type clad layer formed on the semiconductor substrate and allowing conductive particles required to amplify the optical signal to pass,
  - a quantum dot active layer formed close to an upper surface of the first conductive type clad layer and including layers of quantum dots amplifying the optical signal, and
  - a second conductive type clad layer formed close to an upper surface of the quantum dot active layer and operating to correspond to the first conductive type clad layer to allow the conductive particles required for an amplification to pass;
  - wherein the active layer is formed by repeatedly performing an In(x)Ga(1-x)As epitaxial process using InGaAs, an In(y)Ga(1-y)As quantum dot using InGaAs, and an In(z)Ga(1-z)As epitaxial process using InGaAs, where x and z values range from 0 to 0.5, and a y value ranges from about 0.4 to 1.

17. The module of claim 16, where the first and/or second wavelength division multiplexers are separated in two or more steps or are coupled to other wavelength division multiplexers.

18. The module of claim 16, wherein the at least semiconductor quantum dot optical amplifier is coupled to at least one other semiconductor quantum dot optical amplifier.

19. A semiconductor quantum dot optical amplifier module for amplifying an optical signal, comprising: a semiconductor quantum dot optical amplifier, an optical fiber for transferring the optical signal and an isolator on either side of the at least semiconductor quantum dot optical amplifier module, wherein the semiconductor quantum dot optical amplifier includes
a semiconductor substrate made of GaAs;
a first conductive type clad layer formed on an upper surface of the semiconductor substrate and allowing conductive particles required to amplify the optical signal to pass;
a quantum dot active layer formed close to an upper surface of the first conductive type clad layer and including layers of quantum dots amplifying the incident optical signal; and
a second conductive type clad layer formed close to an upper surface of the quantum dot active layer and operating to correspond to the first conductive type clad layer to allow the conductive particles required for an amplification to pass.

20. An optical transmission system for transmitting optical signal, comprising:
an input portion in which at least one different wavelength channel is coupled to one optical signal and output;
an amplifying portion including at least one semiconductor quantum dot optical amplifier module arranged at a regular interval to receive the optical signal from the input portion and amplify the different wavelength channel;
an output portion dividing the optical signal from the amplifying portion into at least channel of different wavelength; and
a transmitting portion for coupling respective components of the optical transmission system to each others,
wherein the semiconductor quantum dot optical amplifier module comprises a semiconductor quantum dot optical amplifier and an optical fiber for transferring the optical signal,
wherein the semiconductor quantum dot optical amplifier includes
a semiconductor substrate made of GaAs;
a first conductive type clad layer formed on an upper surface of the semiconductor substrate and allowing conductive particles required to amplify the optical signal to pass;
a quantum dot active layer formed close to an upper surface of the first conductive type clad layer and including layers of quantum dots amplifying the incident optical signal ; and
a second conductive type clad layer formed close to an upper surface of the quantum dot active layer and operating to correspond to the first conductive type clad layer to allow the conductive particles required for an amplification to pass, wherein the active layer is formed by repeatedly performing an In(x)Ga(1-x) As epitaxial process using InGaAs, an In(y)Ga(1-y) As quantum dot using InGaAs, and an In(z)Ga(1-z) As epitaxial process using InGaAs, where x and z values range from 0 to 0.5, and a y value ranges from about 0.4 to 1.

21. The system of claim 20, wherein the input and output portions include a wavelength division multiplexer.

22. An optical transmission system for transmitting optical signal, comprising:
an input portion in which at least one different wavelength channel is coupled to one optical signal and output;
an amplifying portion including at least one semiconductor quantum dot optical amplifier module arranged at a regular interval to receive the optical signal from the input portion and amplify the different wavelength channel;
an output portion dividing the optical signal from the amplifying portion into at least channel of different wavelength; and
a transmitting portion for coupling respective components of the optical transmission system to each other; and
an isolator in either side of the semiconductor quantum dot optical amplifier module.

23. A semiconductor quantum dot optical amplifier module for amplifying an optical signal, comprising:
a first wavelength division multiplexer located in an input portion of the optical signal and dividing the optical signal into at least one wavelength band;
at least one semiconductor quantum dot optical amplifier for amplifying the optical signal coupled and incident to a band divided from the first wavelength division multiplexer through an active operation of a semiconductor quantum dot;
a second wavelength division multiplexer for coupling and outputting the optical signal amplified by the at least one semiconductor quantum dot optical amplifiers;
an optical fiber for coupling respective components of the respective optical amplifier modules to transfer the optical signal; and
an isolator on either side of the at least semiconductor quantum dot optical amplifier module.

24. An optical transmission system for transmitting an optical signal in a network, comprising:
an amplifying portion including at least one semiconductor quantum dot optical amplifier module and amplifying the transmitted optical signal according a section;
an Input/Output portion performing a communication to receive/output the optical signal from/to an external portion; and
an isolator in either side of the at least semiconductor quantum dot optical amplifier module.

25. A semiconductor quantum dot optical amplifier module for amplifying an optical signal, comprising a semiconductor quantum dot optical amplifier and an optical fiber for transferring the optical signal, wherein the semiconductor quantum dot optical amplifier includes
a semiconductor substrate made of InP;
a first conductive type clad layer formed on an upper surface of the semiconductor substrate and allowing conductive particles required to amplify the optical signal to pass;
a quantum dot active layer formed close to an upper surface of the first conductive type clad layer and including layers of quantum dots amplifying the incident optical signal; and
a second conductive type clad layer formed close to an upper surface of the quantum dot active layer and operating to correspond to the first conductive type clad layer to allow the conductive particles required for an amplification to pass,
wherein the active layer is formed by repeatedly performing an epitaxial process using InGaAsP, an In(y)Ga(1-y)As quantum dot using InGaAs, and an epitaxial process using InGaAs, where a y value ranges from about 0.4 to 1.

26. A semiconductor quantum dot optical amplifier module for amplifying an optical signal, comprising a semiconductor quantum dot optical amplifier and an optical fiber for transferring the optical signal, wherein the semiconductor quantum dot optical amplifier includes
a semiconductor substrate made of InP;

a first conductive type clad layer formed on an upper surface of the semiconductor substrate and allowing conductive particles required to amplify the optical signal to pass;

a quantum dot active layer formed close to an upper surface of the first conductive type clad layer and including layers of quantum dots amplifying the incident optical signal; and a second conductive type clad layer formed close to an upper surface of the quantum dot active layer and operating to correspond to the first conductive type clad layer to allow the conductive particles required for an amplification to pass, wherein the active layer is formed by repeatedly performing an epitaxial process using InAlGaAs, an In(y)Ga(1-y)As quantum dot using InGaAs, and an epitaxial process using InAlGaAs, where a y value ranges from about 0.4 to 1.

27. A semiconductor quantum dot optical amplifier module for amplifying an optical signal, comprising:

a first wavelength division multiplexer located in an input portion of the optical signal and dividing the optical signal into at least one wavelength band;

at least one semiconductor quantum dot optical amplifier for amplifying the optical signal coupled and incident to a band divided from the first wavelength division multiplexer through an active operation of a semiconductor quantum dot;

a second wavelength division multiplexer for coupling and outputting the optical signal amplified by the at least one semiconductor quantum dot optical amplifiers; and an optical fiber for coupling respective components of the respective optical amplifier modules to transfer the optical signal;

wherein the semiconductor quantum dot optical amplifier includes a semiconductor substrate made of InP, a first conductive type clad layer formed on the semiconductor substrate and allowing conductive particles required to amplify the optical signal to pass, a quantum dot active layer formed close to an upper surface of the first conductive type clad layer and including layers of quantum dots amplifying the optical signal, and a second conductive type clad layer formed close to an upper surface of the quantum dot active layer and operating to correspond to the first conductive type clad layer to allow the conductive particles required for an amplification to pass, wherein the active layer is formed by repeatedly performing an epitaxial process using InGaAsP, an In(y)Ga(1-y)As quantum dot using InGaAs, and an epitaxial process using InGaAs, where a y value ranges from about 0.4 to 1.

28. A semiconductor quantum dot optical amplifier module for amplifying an optical signal, comprising:

a first wavelength division multiplexer located in an input portion of the optical signal and dividing the optical signal into at least one wavelength band;

at least one semiconductor quantum dot optical amplifier for amplifying the optical signal coupled and incident to a band divided from the first wavelength division multiplexer through an active operation of a semiconductor quantum dot;

a second wavelength division multiplexer for coupling and outputting the optical signal amplified by the at least one semiconductor quantum dot optical amplifiers; and an optical fiber for coupling respective components of the respective optical amplifier modules to transfer the optical signal, wherein the semiconductor quantum dot optical amplifier includes:

a semiconductor substrate made of InP;

a first conductive type clad layer formed on the semiconductor substrate and allowing conductive particles required to amplify the optical signal to pass, a quantum dot active layer formed close to an upper surface of the first conductive type clad layer and including layers of quantum dots amplifying the optical signal, and a second conductive type clad layer formed close to an upper surface of the quantum dot active layer and operating to correspond to the first conductive type clad layer to allow the conductive particles required for an amplification to pass, wherein the semiconductor substrate is made of InP, and the active layer is formed by repeatedly performing an epitaxial process using InAlGaAs, an In(y)Ga(1-y)As quantum dot using InGaAs, and an epitaxial process using InAlGaAs, where a y value ranges from about 0.4 to 1.

* * * * *